United States Patent
Chen et al.

(10) Patent No.: US 7,926,172 B2
(45) Date of Patent: Apr. 19, 2011

(54) EMBEDDED CIRCUIT BOARD AND PROCESS THEREOF

(75) Inventors: Tsung-Yuan Chen, Taoyuan County (TW); Shu-Sheng Chiang, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 952 days.

(21) Appl. No.: 11/774,728

(22) Filed: Jul. 9, 2007

(65) Prior Publication Data
US 2008/0223605 A1    Sep. 18, 2008

(30) Foreign Application Priority Data

Mar. 16, 2007 (TW) ................... 96109062 A

(51) Int. Cl.
*H05K 3/36* (2006.01)
*H05K 3/02* (2006.01)
(52) U.S. Cl. ............... 29/830; 29/831; 29/846
(58) Field of Classification Search ........... 174/260; 29/830–831, 846–853
See application file for complete search history.

(56) References Cited

U.S. PATENT DOCUMENTS 6,691,409 B2   2/2004   Suzuki et al. ............. 29/852

FOREIGN PATENT DOCUMENTS

| CN | 1395463 | 2/2003 |
|---|---|---|
| CN | 1835660 | 9/2006 |

OTHER PUBLICATIONS

Chinese First Examination Report of China Application No. 2007100890018, dated Aug. 21, 2009.

*Primary Examiner* — Jeremy C Norris
(74) *Attorney, Agent, or Firm* — J.C. Patents

(57) ABSTRACT

An embedded circuit board including a glass fiber layer, two dielectric layers, and two circuit layers is provided. The glass fiber layer has a first surface and a second surface corresponding to the first surface. The dielectric layers are disposed on the first surface and the second surface, respectively. The circuit layers are embedded in the dielectric layers above the first surface and the second surface, respectively. The outer surface of each circuit layer is coplanar with the outer surface of each dielectric layer, and a distance between the circuit layer and the glass fiber layer is greater than or equal to 3 μm. In addition, a process of the embedded circuit board is provided.

10 Claims, 5 Drawing Sheets

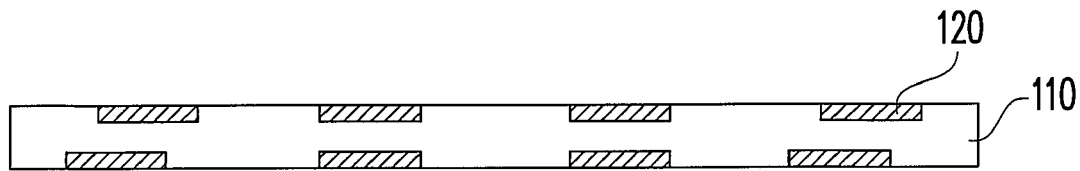

FIG. 1 (PRIOR ART)

| a plurality of carriers are provided, and then a circuit layer and a dielectric layer are formed on each of the carriers, wherein the dielectric layers cover the circuit layers respectively | S1 |

| a glass fiber layer having a first surface and a second surface corresponding to the first surface is provided | S2 |

| the carriers having the circuit layer and the dielectric layer thereon are laminated on the first surface and the second surface of the glass fiber layer, respectively. The dielectric layer and the circuit layer are located between the glass fiber layer and the corresponding carrier, and a preset distance maintained. The preset distance is greater than or equal to 3μm | S3 |

| the carriers are removed | S4 |

FIG. 2

EMBEDDED CIRCUIT BOARD AND PROCESS THEREOF

CROSS-REFERENCE TO RELATED APPLICATION

This application claims the priority benefit of Taiwan application serial no. 96109062, filed Mar. 16, 2007. All disclosure of the Taiwan application is incorporated herein by reference.

BACKGROUND OF THE INVENTION

1. Field of the Invention

The present invention generally relates to a circuit board and process thereof, and more particularly, to an embedded circuit board and process thereof.

2. Description of Related Art

With the rapid advance in fabrication techniques in the electronics industry, a circuit board capable of carrying all kinds of miniaturized electronic components are broadly adopted in many types of electronic products each having a different functions. FIG. 1 is a schematic diagram of a conventional embedded circuit board. In the conventional embedded circuit board 100 as shown in FIG. 1, the circuit layer 120 is embedded in two side surfaces of the core layer 110. However, because the main structural material of the embedded circuit board 100 for the core layer 110 is resin, the embedded circuit board 100 has a low structural reliability. More specifically, the core layer 110 formed using resinous material normally has lower structural strength. Therefore, when an unintended external force is imparted to the embedded circuit board 100, the embedded circuit board 100 can be damaged due to a low structural reliability.

In addition, because the conventional embedded circuit board 100 has a single core layer structure, unwanted electrical connection between the circuit layers 120 on two sides of the core layer 110 may be easily formed due to their close disposition. In other words, the electrical operating environment of the embedded circuit board 100 is poor.

SUMMARY OF THE INVENTION

Accordingly, the present invention is directed to an embedded circuit board having better structural reliability.

The present invention is directed to a process of an embedded circuit board capable of fabricating an embedded circuit board having better structural reliability.

The present invention is also directed to a process of an embedded circuit board capable of fabricating an embedded circuit board having better electrical operating environment.

According to an embodiment of the present invention, a process of an embedded circuit board including the following steps is provided. First, a plurality of carriers are provided. A circuit layer and a dielectric layer are formed on each of the carriers, wherein the dielectric layers cover the circuit layers respectively. Thereafter, a glass fiber layer having a first surface and a second surface corresponding to the first surface is provided. Next, carriers having the circuit layer and the dielectric layer thereon are laminated on the first surface and the second surface of the glass fiber layer, respectively. The dielectric layer and the circuit layer on each carrier are located between the glass fiber layer and the corresponding carrier, and there is a preset distance between each circuit layer and the glass fiber layer. The preset distance is greater than or equal to 3 μm. Afterwards, the carriers are removed.

In an embodiment of the present invention, the process further includes forming at least one conductive hole between the circuit layers for electrically connecting the circuit layers on two sides of the glass fiber layer after removing the carriers.

In an embodiment of the present invention, the method of forming the conductive hole includes performing a micro-mechanical drilling process.

In an embodiment of the present invention, the method of forming the conductive hole includes performing a laser hole burning process.

In an embodiment of the present invention, the method of forming the conductive hole includes performing a plasma hole etching process.

The present invention also provides a process of an embedded circuit board including the following steps. First, a plurality of carriers are provided. A circuit layer is formed on each carrier. Thereafter, a glass fiber layer having a first surface and a second surface corresponding to the first surface is provided. Next, dielectric layers are formed on the first surface and the second surface of the glass fiber layer, respectively. After that, each carrier having the circuit layer thereon is laminated on each dielectric layer, and there is a preset distance between each circuit layer and the glass fiber layer. The preset distance is greater than or equal to 3 μm. Afterwards, the carriers are removed.

In an embodiment of the present invention, the process further includes forming at least one conductive hole between the circuit layers for electrically connecting the circuit layers on two sides of the glass fiber layer after removing the carriers.

In an embodiment of the present invention, the method of forming the conductive hole includes performing a micro-mechanical drilling process.

In an embodiment of the present invention, the method of forming the conductive hole includes performing a laser hole burning process.

In an embodiment of the present invention, the method of forming the conductive hole includes performing a plasma hole etching process.

The present invention also provides an embedded circuit board including a glass fiber layer, two dielectric layers and two circuit layers. The glass fiber layer has a first surface and a second surface corresponding to the first surface. The dielectric layers are disposed on the first surface and the second surface, respectively. The circuit layers are embedded in the dielectric layers above the first surface and the second surface, respectively. There is a preset distance between the circuit layers and the glass fiber layer and the preset distance is greater than or equal to 3 μm. The outer surface of each circuit layer is coplanar with the outer surface of each dielectric layer.

In an embodiment of the present invention, the embedded circuit board further includes a conductive hole disposed between the circuit layers.

In an embodiment of the present invention, a preset distance is maintained between the circuit layers and the glass fiber layer.

In an embodiment of the present invention, the material of the circuit layers is copper (Cu).

In an embodiment of the present invention, the glass fiber layer is glass fiber.

In an embodiment of the present invention, the glass fiber layer is a combination of glass fiber and resin.

In an embodiment of the present invention, the material of the dielectric layer is resin.

In the present invention, the main structure of the embedded circuit board includes a glass fiber layer and two dielectric layers located on each side of the glass fiber layer. The embedded circuit board with the glass fiber layer therein can substantially increase the structural reliability of the embedded circuit board so as to minimize the problem of poor structural reliability in conventional embedded circuit board. In addition, the present invention can effectively control the distance between two circuit layers in the process of fabricating the embedded circuit board. As a result, the embedded circuit board of the present invention can have better electrical operating environment.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a schematic diagram of a conventional embedded circuit board.

FIG. 2 is a flowchart illustrating a process of fabricating an embedded circuit board according to an embodiment of the present invention.

DESCRIPTION OF THE EMBODIMENTS

Figure 3A:
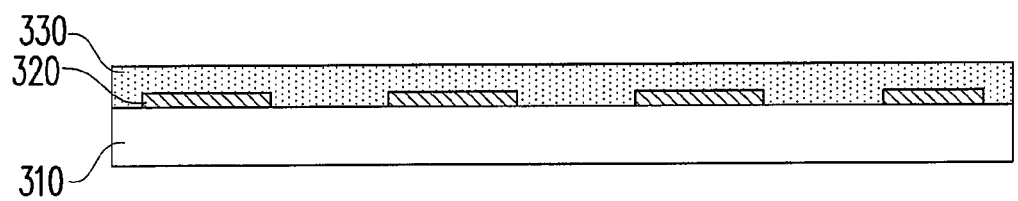
FIGS. 3A to 3D are schematic cross-sectional views showing the process of fabricating the embedded circuit board in FIG. 2.

Reference will now be made in detail to the present preferred embodiments 10 of the invention, examples of which are illustrated in the accompanying drawings. Wherever possible, the same reference numbers are used in the drawings and the description to refer to the same or like parts.

FIG. 2 is a flowchart illustrating a process of fabricating an embedded circuit board according to a preferred embodiment of the present invention. As shown in FIG. 2, the process of the embedded circuit board in the present embodiment includes the following steps. First, at step S1, a plurality of carriers are provided, and then a circuit layer and a dielectric layer are formed on each of the carriers, wherein the dielectric layers cover the circuit layers respectively. Next, at step S2, a glass fiber layer having a first surface and a second surface corresponding to the first surface is provided. Thereafter, at step S3, carriers having the circuit layer and the dielectric layer thereon are laminated on the first surface and the second surface of the glass fiber layer, respectively. The dielectric layer and the circuit layer are located between the glass fiber layer and the corresponding carrier, and a preset distance between each circuit layer and the glass fiber layer is maintained. The preset distance is greater than or equal to 3 μm. Next, at step S4, the carriers are removed. The foregoing is a preliminary description of the process flow of the embedded circuit board according to the present embodiment. In the following, a detailed description using schematic cross-sectional views to illustrate the foregoing process of fabricating the embedded circuit board is provided.

Figure 3B:
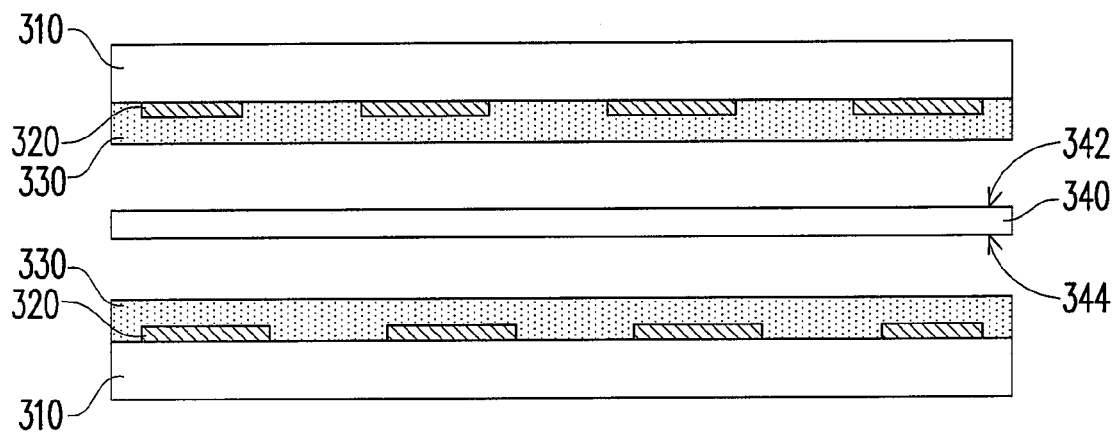

FIGS. 3A to 3D are schematic cross-sectional views showing the process of fabricating the embedded circuit board in FIG. 2. The method of fabricating the embedded circuit board is as follows. First, as shown in FIG. 3A, at least one carrier 310 (only one carrier 310 is shown in FIG. 3A) is provided and then a circuit layer 320 and a dielectric layer 330 are formed on the carrier 310. More specifically, a circuit layer 320 made of a material, for example, copper, is formed on a carrier 310, for example, a metal plate. Next, a dielectric layer 330 made of, for example, resin or other organic materials, is formed on the carrier 310. The dielectric layer 330 may or may not be reinforced using solid filler, for example, reinforced using inorganic filler. The circuit layer 320 is formed on the carrier 310 by the application of an electroplating process, for example, and the dielectric layer 330 covers the circuit layer 320. Thereafter, as shown in FIG. 3B, a glass fiber layer 340 is provided. The glass fiber layer 340 has a first surface 342 and a second surface 344 corresponding to the first surface 342. In the present embodiment, two carriers 310 are shown in FIG. 3B and they are located on two sides of the glass fiber layer 340, respectively. Furthermore, the glass fiber layer 340 is made of glass fiber, a combination of glass fiber and resin, or an organic substrate having reinforced glass fiber, for example.

Figure 3C:
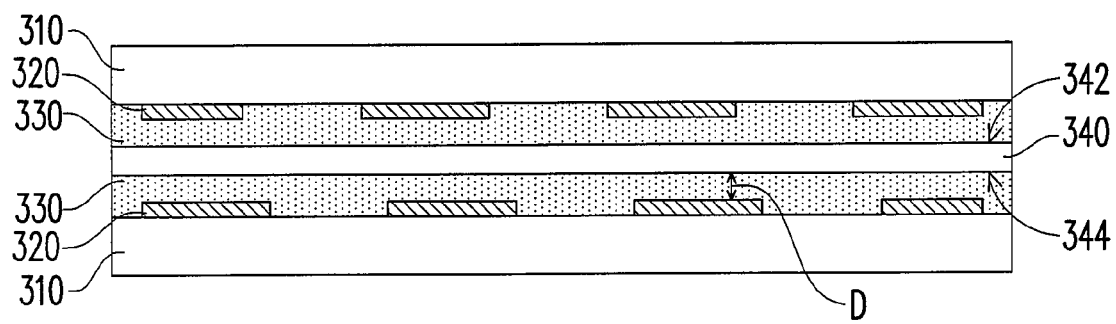
Figure 3D:
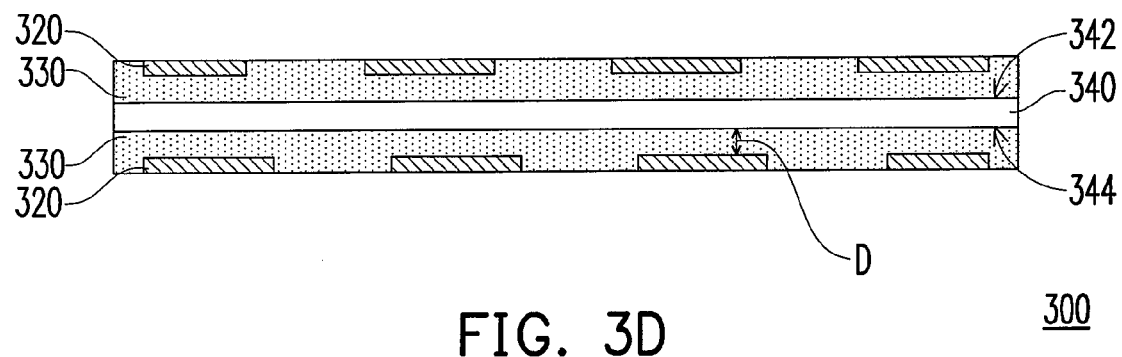

Next, as shown in FIG. 3C, carriers 310 having the circuit layer 320 and the dielectric layer 330 thereon are laminated on the first surface 342 and the second surface 344 of the glass fiber layer 340, respectively. The dielectric layers 330 and the circuit layers 320 are located between the glass fiber layer 340 and the carriers 310. After that, as shown in FIG. 3D, the carriers 310 are removed to form the embedded circuit board 300 of the present embodiment. In the present embodiment, the circuit layers 320 are embedded in the dielectric layer 330 above the first surface 342 and the dielectric layer 330 above the second surface 344, respectively. Furthermore, the outer surface of the circuit layers 320 and the outer surface of the dielectric layer 330 are coplanar. In other words, the embedded circuit board 300 of the present embodiment has flat circuit board surfaces.

Figure 4:
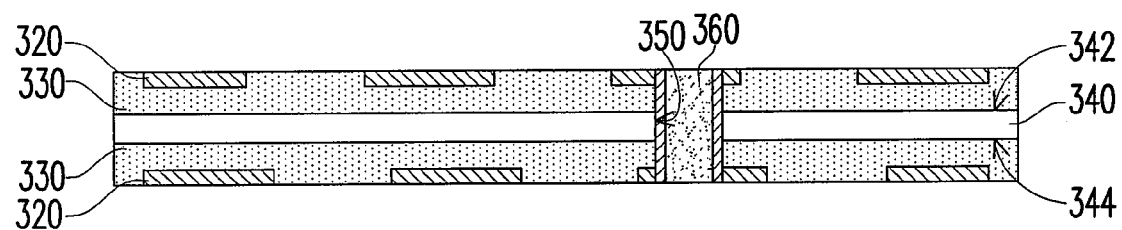
FIG. 4 is a schematic cross-sectional view of an embedded circuit board having a conductive hole therein.
Figure 5A:
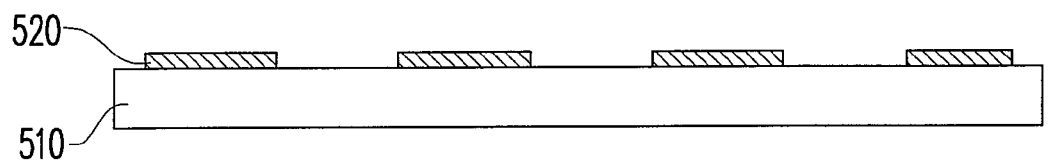
FIGS. 5A to 5D are schematic cross-sectional views of showing a process of fabricating another embedded circuit board according to a preferred embodiment of the present invention.
Figure 5B:
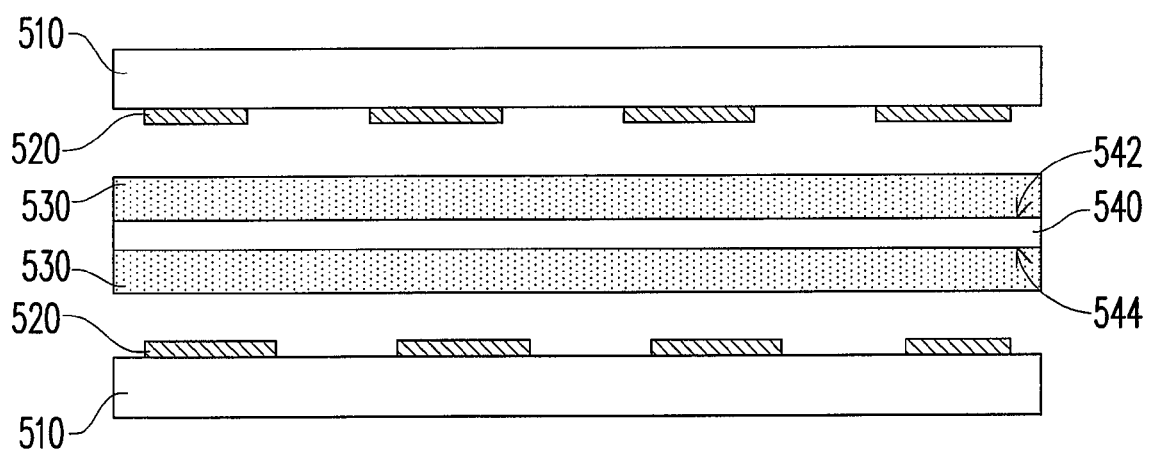
Figure 5C:
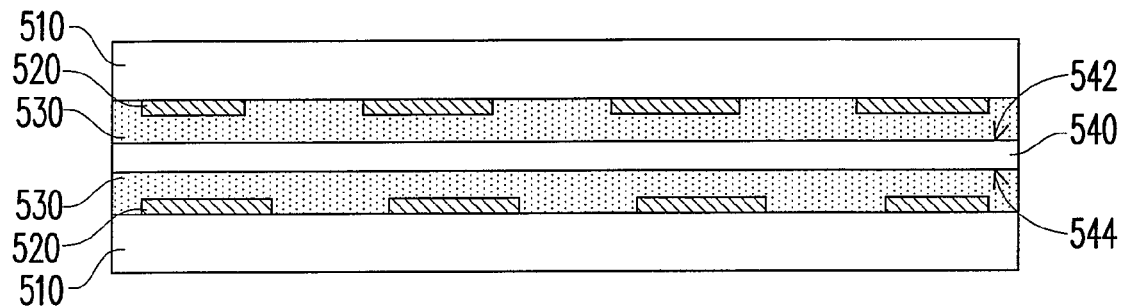
Figure 5D:
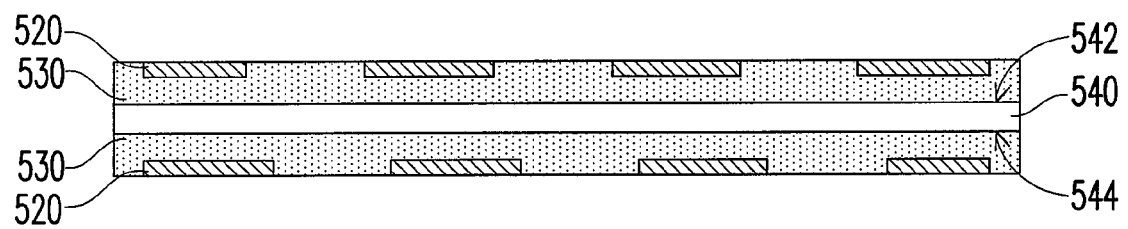

To provide electrical connection relationship between the circuit layers 320 on each side of the embedded circuit board 300', a conductive hole 350 for electrically connecting two circuit layers 320 (an embedded circuit board having a conductive hole therein is shown in FIG. 4) is formed between the two circuit layers 320 after executing the step (of removing the carriers 310) in FIG. 3D. The conductive hole 350 is a conductive through hole or a conductive blind via, for example. In FIG. 4, the conductive hole 350 is a conductive through hole. In the present embodiment, a laser drilling process, a laser hole burning process, a plasma hole etching process or some other suitable technique, for example, is used to form a hole. After that, a conductive circuit is formed on the inner wall of the hole to connect the circuit layers 320 on two sides of the glass fiber layer 340, thereby forming the conductive hole 350. Consequently, the circuit layers 320 on two sides of the glass fiber layer 340 can transmit electrical signals to each other through the conductive hole 350. On the other hand, an insulating material 360 such as ink can be used to fill the conductive hole 350 in the present embodiment so as to prevent moisture from entering into the conductive hole 350 so that the so-called popcorn effect may be effectively reduced or eliminated.

It should be noted that the embedded circuit boards 300 and 300' have better structural reliability because the embedded circuit boards 300 and 300' are built using the glass fiber layer 340 and the dielectric layers 330 on two sides of the glass fiber layer 340. Furthermore, the present invention can control the thickness (refer to FIG. 3A) of the dielectric layer 330 in the process of fabricating the embedded circuit boards 300 and 300'. Therefore, a preset distance D (the preset distance D is greater than or equal to 3 µm) is maintained between the circuit layers 320 and the glass fiber layer 340 after the lamination process as shown in FIG. 3C. Consequently, the circuit layers 320 on two sides of the embedded circuit board are kept at a suitable distance apart. Therefore, even if the glass fiber layer 340 is impregnated with moisture, a suitable distance still separates the two circuit layers 320 so that unintended electrical conduction between the two circuit layers 320 may be effectively prevented. In other words, the embedded circuit boards 300 and 300' of the present invention have better electrical operating environment.

In addition, the process of fabricating the embedded circuit board shown in FIGS. 3A to 3D is not the only process of implementing the present invention. In the following, another process of implementing the present invention is described.

FIGS. 5A to 5D are schematic cross-sectional views showing a process of fabricating another embedded circuit board according to an embodiment of the present invention. The process as show in FIGS. 5A to 5D is similar to the aforementioned process of fabricating the embedded circuit board. The main difference is that only the circuit layer 520 is formed on the carrier 510 while the dielectric layers 530 are pre-fabricated on the first surface 542 and the second surface 544 of the glass fiber layer 540. Therefore, the process of the embedded circuit board in the present embodiment can still produce an embedded circuit board 500 similar to the one in FIG. 3D after performing the lamination process and removing the carriers 510. The other processes of embedded circuit board of the present embodiment are similar to those described with reference to FIGS. 3A to 3D, and detailed description thereof is omitted.

Although the step of 'providing the carrier' is described before the step of 'providing the glass fiber layer' in the process of embedded circuit board of the foregoing embodiment, the present invention is not intended to limit the process sequence as such. In other words, in another embodiment, the step of 'providing the glass fiber layer' can be performed before the step of 'providing the carrier'.

In summary, the embedded circuit board of the present invention is built using a glass fiber layer and the dielectric layers disposed on two sides of the glass fiber layer. Therefore, compared to the conventional embedded circuit board, the embedded circuit board of the present invention has better structural reliability (the disposition of a glass fiber layer within the embedded circuit board can substantially increase the structural reliability of the embedded circuit board). Furthermore, the present invention can control the thickness of the dielectric layer in the process of fabricating the embedded circuit board. Therefore, a preset distance can be maintained between the circuit layers and the glass fiber layer through the dielectric layer after the lamination process and carrier removing process. Consequently, the circuit layers on two sides of the embedded circuit board are kept at a suitable distance apart. Therefore, even if the glass fiber layer is impregnated with moisture, a suitable distance still separates the two circuit layers so that unintended electrical conduction between the two circuit layers is prevented (for example, if the circuit layers on two sides of the embedded circuit board are disposed too close to the glass fiber layer and at the same time the glass fiber layer is impregnated with moisture, the circuit layers on two sides of the embedded circuit board may electrically conduct through the moisture-impregnated glass fiber layer). In other words, the embedded circuit boards 300 and 300' of the present invention have better electrical operating environment.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of an embedded circuit board, comprising:
    Providing a plurality of carriers and forming a circuit layer and a dielectric layer on each of the carriers, wherein the dielectric layers cover the circuit layers respectively;
    providing a glass fiber layer, wherein the glass fiber layer has a first surface and a second surface corresponding to the first surface;
    laminating the carriers on the first surface and the second surface of the glass fiber layer respectively, wherein the dielectric layer and the circuit layer on each carrier are located between the glass fiber layer and the corresponding carrier, and there is a preset distance maintained between each circuit layer and the glass fiber layer, and wherein the preset distance is greater than or equal to 3 µm; and
    removing the carriers.

2. The process according to claim 1, further comprising a step of forming at least one conductive hole between the circuit layers for electrically connecting the circuit layers on two sides of the glass fiber layer after the step of removing the carriers.

3. The process according to claim 2, wherein the step of forming the conductive hole comprises performing a micromechanical drilling process.

4. The process according to claim 2, wherein the step of forming the conductive hole comprises performing a laser hole burning process.

5. The process according to claim 2, wherein the step of forming the conductive hole comprises performing a plasma hole etching process.

6. A process of an embedded circuit board, comprising:
    providing a plurality of carriers and forming a circuit layer on each of the carriers;
    providing a glass fiber layer, wherein the glass fiber layer has a first surface and a second surface corresponding to the first surface;
    forming dielectric layers on the first surface and the second surface of the glass fiber layer respectively;
    laminating the carriers on the dielectric layers respectively, and a preset distance is maintained between each circuit layer and the glass fiber layer, and wherein the preset distance is greater than or equal to 3 µm; and
    removing the carriers.

7. The process according to claim 6, further comprising a step of forming at least one conductive hole between the circuit layers for electrically connecting the circuit layers on two sides of the glass fiber layer after the step of removing the carriers.

8. The process according to claim 7, wherein the step of forming the conductive hole comprises performing a micromechanical drilling process.

9. The process according to claim 7, wherein the step of forming the conductive hole comprises performing a laser hole burning process.

10. The process according to claim 7, wherein the step of forming the conductive hole comprises performing a plasma hole etching process.

* * * * *